(12) United States Patent
Keene et al.

(10) Patent No.: US 6,339,328 B1
(45) Date of Patent: Jan. 15, 2002

(54) MAGNETIC GRADIOMETER INCORPORATING GLOBAL FEEDBACK

(75) Inventors: Mark N Keene; Julian S Satchell, both of Malvern (GB)

(73) Assignee: The Secretary of State for Defence, Farnborough (GB)

( * ) Notice: Subject to any disclaimer, the term of this patent is extended or adjusted under 35 U.S.C. 154(b) by 0 days.

(21) Appl. No.: 09/341,991

(22) PCT Filed: Mar. 6, 1998

(86) PCT No.: PCT/GB98/00685

§ 371 Date: Jul. 22, 1999

§ 102(e) Date: Jul. 22, 1999

(87) PCT Pub. No.: WO98/40757

PCT Pub. Date: Sep. 17, 1998

(30) Foreign Application Priority Data

Mar. 10, 1997 (GB) .............................................. 9704911

(51) Int. Cl.$^7$ .............................................. G01R 33/02
(52) U.S. Cl. ........................................ 324/248; 324/225
(58) Field of Search ................................ 324/248, 244, 324/225; 338/32 R; 505/846

(56) References Cited

U.S. PATENT DOCUMENTS

| | | | |
|---|---|---|---|
| 3,943,481 A | * | 3/1976 | Masuda et al. ........... 338/32 R |
| 5,020,538 A | | 6/1991 | Morgan et al. |
| 5,122,744 A | * | 6/1992 | Koch .......................... 324/248 |
| 5,488,295 A | * | 1/1996 | Seppa ......................... 324/248 |

OTHER PUBLICATIONS

Koch R H Et Al: "Room temperature three sensor magnetic field gradiometer" Review of Scientific Instruments, Jan. 1996, AIP, USA, vol. 67, No. 1, ISSN 0034–6748, pp. 230–235, XP002067264 see page 232, left–hand column.

* cited by examiner

Primary Examiner—Safet Metjahic
Assistant Examiner—Subhash Zaveri
(74) Attorney, Agent, or Firm—Nixon & Vanderhye P.C.

(57) ABSTRACT

A gradiometer for measuring properties of a magnetic field and in particular, for measuring magnetic field gradient components, comprising at least two magnetic sensors wherein at least two of the magnetic sensors are arranged to sense the magnetic field component in substantially the same direction. The magnetic sensors may be super conducting quantum interference device (SQUID) magnetometers, Hall probes, flux gates or magneto-resistive magnetometers. The gradiometer also includes a computer processor loaded with an adaptive signal-processing algorithm, for performing adaptive signal balancing of the magnetometer outputs. In a preferred embodiment the gradiometer may comprise at least eight magnetometers in a three-dimensional arrangement, and a set of three orthogonal global feedback coils, one for each direction x, y, z, such that the five independent magnetic field gradient components may be measured. The gradiometer may also be used to measure second or higher order magnetic field gradient components.

23 Claims, 7 Drawing Sheets

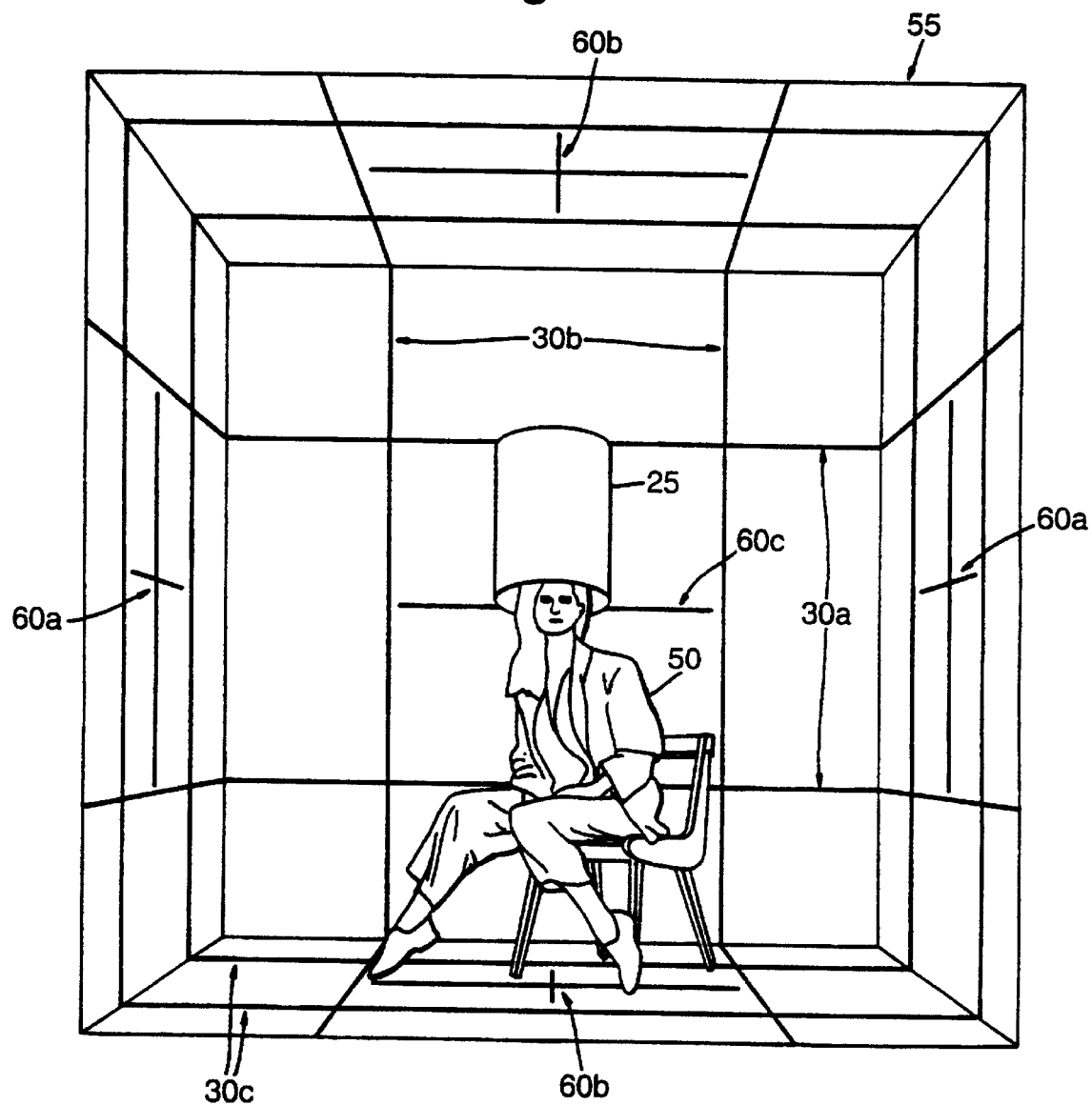

MAGNETIC GRADIOMETER INCORPORATING GLOBAL FEEDBACK

BACKGROUND OF THE INVENTION

1. Field of the Invention

The invention relates to apparatus for measuring magnetic field information, and may be used in particular for determining components of magnetic field gradient. The system may be used to detect magnetic field gradients of the order of 100 fT m$^{-1}$ from a moving platform in the background of the earth's magnetic field (approximately 70 $\mu$T).

2. Discussion of Prior Art

SQUID (superconducting quantum interference devices) magnetometers are extremely sensitive devices which can measure vector components of magnetic field as small as $10^{-9}$ times the ambient field of the earth. Measurement of fields near to the threshold of sensitivity in the presence of the earth's field present many difficulties. Geomagnetic noise and man-made noise, for example, are always dominant. Furthermore, unless the SQUIDs are rigidly mounted, even minute motions in the earth's field will be reflected as gross changes in output and therefore it is often more useful to sense the gradient in a magnetic field, rather than the field itself.

The gradient of a magnetic field may be measured by using an intrinsic SQUID gradiometer. An intrinsic SQUID gradiometer has sensing coils made up of two loops connected with opposite polarity. In such a configuration the sensing coils must be highly balanced and aligned and small fractional changes in the effective size or orientation of each coil produce output signals from uniform fields which are indistinguishable from real gradients. Balancing is usually achieved by adjustment in special calibration rigs under laboratory conditions and is an expensive and time consuming process. Furthermore, as a large background field is incident on the sensor, currents are induced in the structure which give rise to 1/f noise and can give rise to hysteresis problems.

The gradient signal is larger for coils separated by a longer baseline, the useable baseline being limited by the tolerable inductance in the connections to the coils. This restriction on baseline can be removed by replacing the gradiometer sensor by a pair of magnetometers, where outputs are subtracted to form a configured gradiometer. Such a configuration requires great stability and linearity in both time and frequency domains. Furthermore, as well as the difficulties in balancing, each sensor requires a very large dynamic range (better than 1 part in $10^9$) if it is to be operable on a moving platform, as is often required. In addition, there is still the problem that the field is incident on the structure.

In U.S. Pat. No. 5 122 744, an aligned three sensor configured gradiometer (Three SQUID Gradiometer, TSG) is described in which a central sensor is used to feedback that component of the earth's field to coils surrounding each of the three sensors. The outputs of the outer pair of sensors are subtracted and this difference gives a measure of the required gradient if the feedback field is uniform. In this configuration, the dynamic range is considerably improved and one component of the earth's field is not directly incident upon the sensors.

The same technique has been extended to gradiometers based on fluxgate magnetometers rather than SQUID magnetometers [R. H. Koch et al. "Room temperature three sensor magnetic field gradiometer" Review of Scientific Instruments, Jan. 1996, AIP, USA, vol. 67, No. 1, pages 230–235].

However, the problems of stability, non-linearity, uniformity of feedback and the need to calibrate and fix the balance are not overcome. It is the difficulty of accurately subtracting the sensor outputs which give rise to many of the problems.

Also relevant to the present invention is the processing technique used to compensate for motion noise in extremely low frequency submarine receiving antennas [R. J. Dinger and J. R. Davis, Proc. IEEE, vol.64, No. 10, Oct. 1976].

An additional technique for improving the performance of SQUID sensors, based on adaptive positive feedback, is known from U.S. Pat. No. 5,488,295.

For the purposes of this specification, the term magnetometer shall be taken to refer to a device for measuring the magnetic field component in a particular direction and the term gradiometer shall be taken to refer to a device for measuring magnetic field gradient components. A total field magnetometer shall be taken to refer a device for measuring the total magnetic field i.e. the square root of the sum of the squares of the magnetic field components in three orthogonal directions.

SUMMARY OF THE INVENTION

According to the present invention, a system for measuring one or more magnetic field gradient component of a magnetic field comprises;

(i) at least two magnetic sensors for sensing a magnetic field, wherein each sensor generates a sensor output, said sensor outputs having an associated total energy, E, and wherein at least two of the sensors are arranged to sense the magnetic field in substantially the same direction and (ii) means for performing adaptive signal processing of the sensor outputs such that the system is adaptively balanced, whereby said means generate one or more magnetic field gradient components, characterised in that (iii) the system incorporates global feedback means for providing a substantially uniform magnetic field at the two or magnetic sensors, and (iv) the adaptive signal processing means comprise means for minimising the total energy, E, of the sensor outputs subject to a constraint, whereby the constraint determines which of one or more magnetic field gradient components is generated.

The invention provides the advantage that it eliminates the need to calibrate and fix the balance under controlled conditions and to maintain that calibration for long periods. Furthermore, the requirements on the mechanical rigidity and stability required for low noise operation are considerably relaxed. The advantages of the known configured systems are maintained.

In a preferred embodiment, the means for minimising the total energy, E, of the sensor outputs may also generate a total magnetic field measurement, whereby the constraint determines which of one or more magnetic field gradient components or a total magnetic field measurement is generated.

In a further preferred embodiment, the gradiometer may comprise a computer on which an adaptive signal processing algorithm (ASPA) is loaded.

The gradiometer global feedback means may also be arranged to provide a substantially uniform magnetic field gradient at the two or more magnetic sensors. The global feedback means may comprise at least one global feedback coil set. For example, each set may comprise two or more Helmholtz coils.

The gradiometer may also comprise;

means for generating at least one difference signal between two sensor outputs, wherein said sensor outputs each correspond to a magnetic field in substantially the same direction, and analogue to digital conversion means for converting the one or more difference signal and the two or more sensor outputs into equivalent digital data.

At least one of the magnetic sensors may be one of a fluxgate, a Hall probe, a magneto-resistive sensor or a superconducting quantum interference device (SQUID) magnetometer. Alternatively, at least one of the magnetic sensors may be a gradiometer.

If a SQUID magnetometer is included in the gradiometer, the gradiometer also includes cooling means for reducing the temperature of the SQUID magnetometer. Each SQUID magnetometer may have associated local feedback means for maintaining a substantially constant state of magnetic flux in the respective SQUID magnetometer.

In one embodiment of the invention, the gradiometer comprises;

at least four magnetic sensors for sensing a magnetic field, wherein three of the sensors are arranged such that they sense the magnetic field in three substantially orthogonal directions and wherein at least two of said sensors are arranged such that they sense the magnetic field in substantially the same direction.

In a further preferred embodiment, the gradiometer may comprise at least eight magnetic sensors. For example, the eight or more magnetic sensors may be arranged at the vertices of a tetrahedron structure. In this configuration, the three global feedback coil sets may be oriented in three substantially orthogonal directions, for generating a substantially uniform magnetic field at each of the eight or more magnetic sensors.

In another embodiment, the gradiometer may comprise at least three magnetic sensors, wherein at least three of the sensors are oriented in substantially the same direction and whereby the means for performing adaptive signal processing may generate a magnetic field gradient component of at least second order.

In another embodiment of the invention, the system may be arranged to provide a biomagnetic sensing system. The at least one global feedback coil set may be arranged to surround a subject, for example a human subject, generating a magnetic field to be measured wherein the subject may be in close proximity to the magnetic sensors. This system provides an advantage over conventional biomagnetic sensing systems in that the large magnetically shielded room required in conventional systems is no longer needed.

According to another aspect of the invention, a method for measuring at least one magnetic field gradient component using a gradiometer comprises the steps of;

(i) sensing a magnetic field component at two or more positions using two or more magnetic sensors, wherein at least two of the magnetic field components are sensed in substantially the same direction, (ii) generating two or more output signals, having an associated total energy, E, corresponding to said magnetic field components, (iii) providing global feedback in the form of a substantially uniform magnetic field at the two or more magnetic sensors, (iv) performing adaptive signal processing of the output signals and minimising the total energy, E, of the output signals subject to a constraint such that the gradiometer is adaptively balanced, (v) constraining the minimisation of the total energy, E, such that a magnetic field gradient component is generated, and (vi) generating at least one magnetic field gradient component measurement.

In one embodiment of this aspect of the invention, the method may comprise the steps of;

(i) minimising the total energy, E, of the output signals subject to a constraint such that the gradiometer is adaptively balanced, and (ii) constraining the minimisation of the total energy, E, such that a total magnetic field measurement is generated.

In an alternative embodiment of this aspect of the invention, the method may comprise the step of providing a substantially uniform magnetic field gradient at the two or more magnetic sensors. The method may be used for measuring magnetic field components in a human subject in close proximity with the two or more magnetic sensors.

In another embodiment of this aspect of the invention, the method may comprise the steps of;

(i) sensing the magnetic field component at three or more positions, wherein at least three of said magnetic field components are sensed in substantially the same direction, (ii) minimising the total energy, E, of the output signals subject to a constraint such that the gradiometer is adaptively balanced, and (iii) constraining the minimisation of the total energy, E, such that a magnetic field gradient component of at least second order is generated.

The system utilises an adaptive signal processing technique to achieve high levels of balance. The application of this technique to magnetic detection with gradiometer systems is unknown. The employment of adaptive signal processing is essential to allow the system to utilise a scheme of global (or overall) magnetic field feedback. For a system from a moving platform, this provides sufficient dynamic range for the system to operate in the earth's field whilst maintaining high levels of balance. Furthermore, it also provides the advantage that it prohibits the ambient external field impinging directly on the sensors. Furthermore, it relaxes the mechanical rigidity constraints for the system.

BRIEF DESCRIPTION OF THE DRAWINGS

The invention will now be described, by example only, with reference to the following figures in which;

FIG. 8 shows a schematic diagram of a global feedback gradiometer for obtaining five independent magnetic field gradient measurements and FIG. 9 shows an arrangement of a biomagnetic sensing system of the invention.

DETAILED DISCUSSION OF PREFERRED EMBODIMENTS

Figure 1:
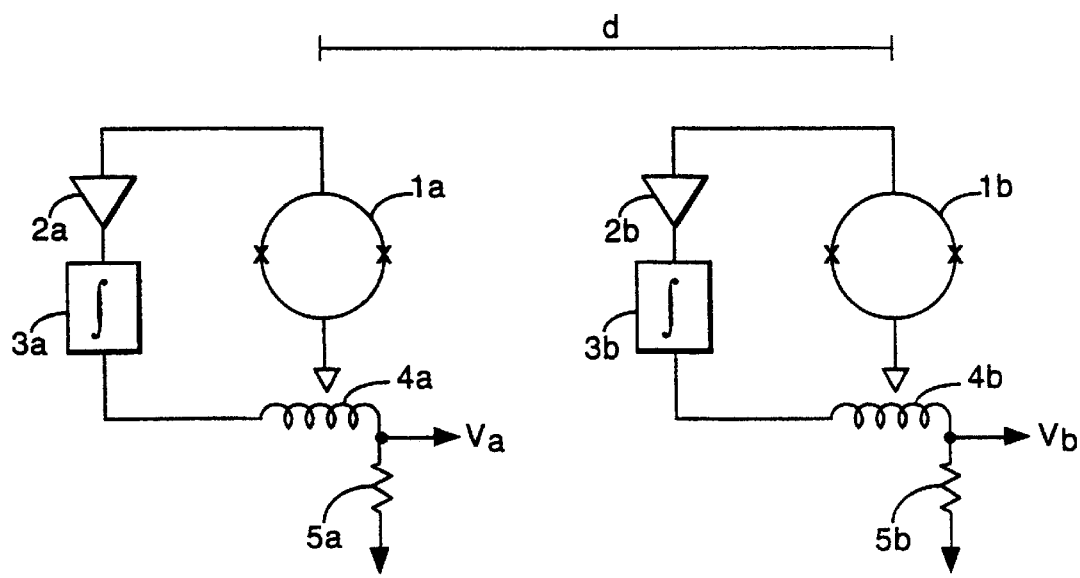
FIG. 1 shows a schematic diagram of a conventional configured gradiometer device for measuring magnetic field gradients, based on two SQUID magnetometers.

Referring to FIG. 1, a conventional configured gradiometer for measuring the magnetic field gradient may comprise two magnetometers 1a, 1b, typically SQUID magnetometers, separated by a distance d (baseline distance), whereby each magnetometer 1a, 1b measures the magnetic field at its particular location. The gradiometer also comprises amplifiers 2a,2b and integrators 3a,3b, feedback coils 4a,4b and resistors 5a,5b, having the same resistance, for providing a correction current producing a field equal and opposite to that of the external magnetic field incident on the SQUIDs. Voltages Va, Vb are output from the device corresponding to the magnetic field at each of the SQUID magnetometers 1a, 1b respectively. The difference between the two voltages, Va–Vb, provides an approximation of the magnetic field gradient.

The two magnetometer gradiometer shown in FIG. 1 has a large common mode signal of the two SQUIDs, arising from the earth's magnetic field and requires an almost impossibly large degree of common mode rejection of an amplifier taking the difference in the outputs of the two SQUID magnetometers 1a, 1b. Furthermore, each magnetometer and associated amplifier requires a very large dynamic range (better than 1 part in $10^9$) and an exceptionally high linearity if it is to be successfully operated from a moving platform.

Figure 2:
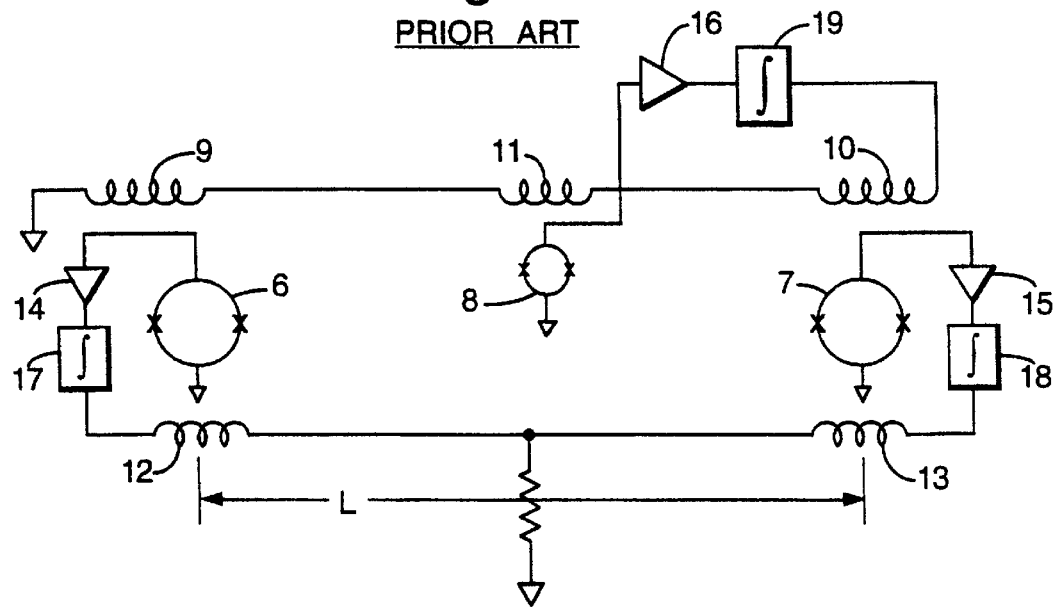
FIG. 2 shows a schematic diagram of a three SQUID gradiometer device known in the prior art.

Referring to FIG. 2, a conventional three magnetometer configured gradiometer (TSG) (U.S. Pat. No. 5,122,744) comprises three SQUID magnetometers 6,7,8 and five feedback coils 9,10,11,12,13. The SQUIDs 6,7 are sensor SQUIDs used to measure the magnetic field at their respective locations and are separated by a distance l. The SQUID 8 acts as a reference magnetometer and is used to cancel out the effect of the background magnetic field from the earth's magnetic field in SQUIDs 6,7 via the feedback coils 9,10 provided with a signal from the reference SQUID 8. Amplifiers 14,15,16, and integrators 17,18,19 are also shown in the figure.

The reference SQUID magnetometer 8 is operated in a similar way to the sensor SQUID magnetometers 6,7 except the feedback signal for SQUID 8 is applied to all three SQUIDs 6,7,8 via the feedback coils 9,10,11. Amplifier 16 and integrator 19 are used to generate the feedback signals to coils 9,10,11 which subtract the background magnetic field from SQUIDs 6,7,8 respectively.

The field gradient is measured by subtracting the outputs from the two sensor SQUIDs 6,7. One advantage of the three SQUID system is that these outputs are much smaller than those measured using a two SQUID gradiometer (FIG. 1). However, in this configured system the problems of stability, non-linearity and uniformity of feedback, and the need to calibrate and fix the balance, are not overcome.

Figure 3:
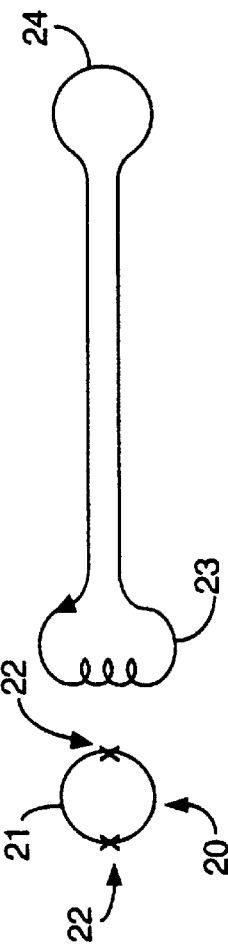
FIG. 3 shows a diagram of a SQUID magnetometer device.

By way of background to the invention, the operation of a SQUID magnetometer is described with reference to FIG. 3. The SQUID 20 comprises a superconducting loop 21 having at least one weak link 22 (e.g. Josephson junction) which can exhibit a periodic current-phase relation. The SQUID is magnetically coupled to a superconducting flux transformer via an input coil 23. The flux transformer pickup coil 24 senses the field to be measured. When there is a change in the magnetic field to be detected, a circulating current will be induced in the input coil 23. The circulating current produces a magnetic field which couples to the SQUID loop 21 and is detected. A SQUID (as shown in FIGS. 1,2,3 and 4) would usually have an associated flux transformer.

The gradiometer of the present invention can be configured to measure magnetic field gradients, and magnetic fields, originating from distant sources in the presence of the large and substantially uniform field of the earth, in particular if the gradiometer is operated from a moving platform. Alternatively, the gradiometer may be configured to measure magnetic field gradients or magnetic fields originating from sources which are in close proximity to the sensor, where the sensor is not moving but is operating in a magnetically noisy environment.

Figure 5:
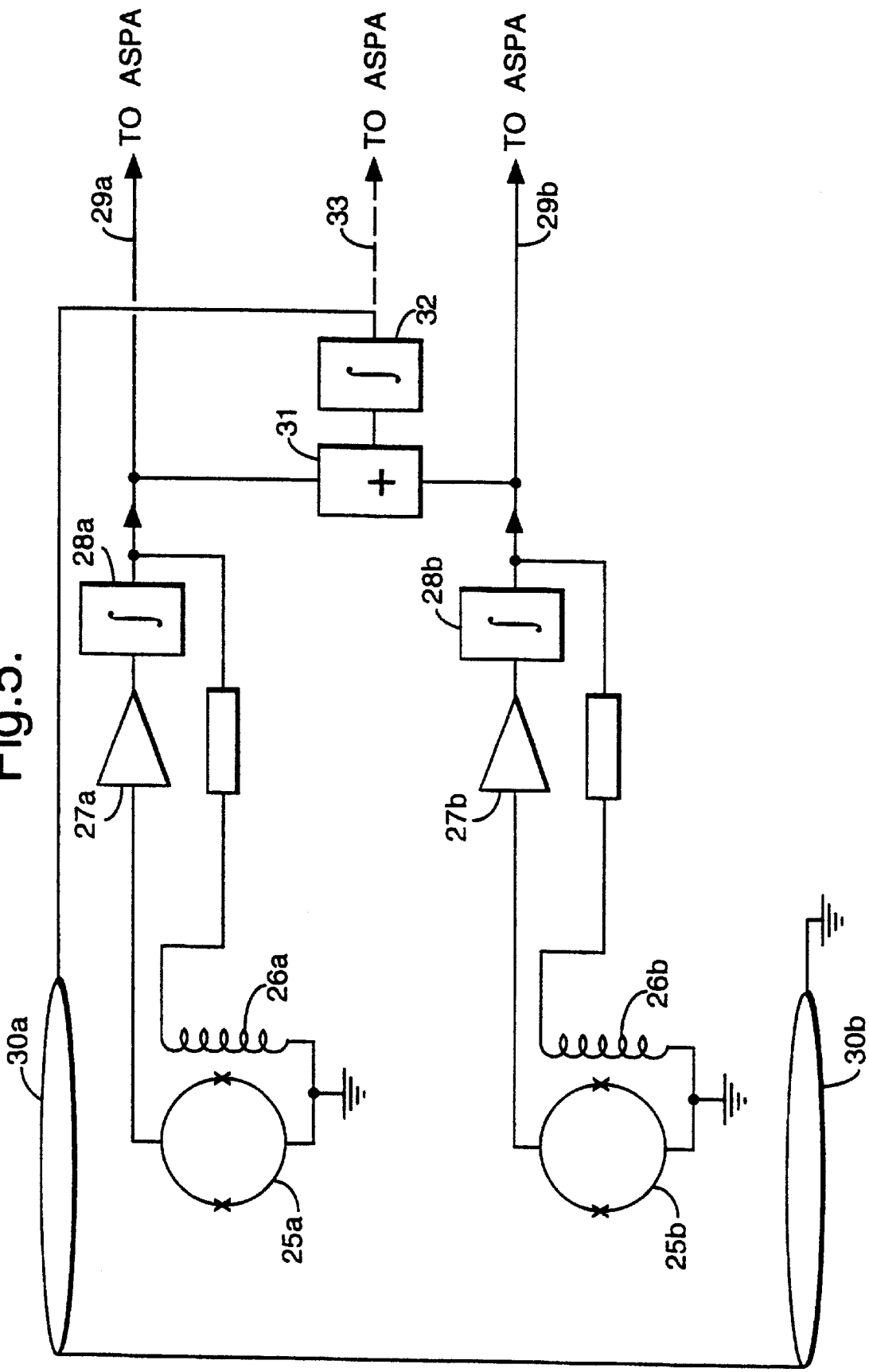
FIG. 5 shows a schematic diagram of a single axis global feedback arrangement of the present invention.

FIG. 5 shows one embodiment of the invention; a single-axis global feedback gradiometer. The system comprises two magnetometers 25a,25b and may be used to measure either magnetic field gradients or, in some configurations, the total magnetic field. The magnetometers 25a,25b are represented as SQUID magnetometers, although other magnetometer devices may also be used, for example, flux gate, Hall probe sensors or magneto-resistive devices.

The two magnetometers 25a,25b are situated one above the other (axial configuration) or side by side (off-axis configuration) and sense the magnetic field in a particular direction. In the case of SQUID magnetometers, each SQUID 25a,25b has its own local feedback coil 26a,26b which surrounds the associated magnetometer 25a,25b. These local feedback coils 26a,26b provide the flux locking for the respective SQUID magnetometers 25a,25b, as known in the prior art (see FIGS. 1 and 2).

Each channel has an associated amplifier 27a,27b and integrator 28a,28b and therefore each magnetometer 25a, 25b has readout electronics which operate in a flux locked loop mode, using integral feedback via 28a,28b, such that the electronics' feedback flux maintains a constant state of flux, whether finite or zero, in each magnetometer 25a,25b.

As the flux in the magnetometers 25a,25b is constant, the feedback current is proportional to the external field applied to each magnetometer 25a,25b and the outputs 29a,29b from the magnetometers' readout electronics therefore give a measure of the feedback current in the relevant magnetometer channel. The magnetometer channel outputs 29a,29b, from integrators 28a,28b respectively, are then input to adaptive signal processing means (to be described later).

The system also comprises global (common mode) feedback coils 30a,30b which enclose the magnetometers 25a, 25b. For the purpose of this specification, the term global feedback shall be taken to mean the use of one or more remote coil sets to apply magnetic feedback to all of the magnetic sensors simultaneously. The output signals 29a, 29b from the magnetometer channels are passed to a component 31 for electronically adding the magnetic field outputs from the two magnetometers 25a,25b and then to a global feedback integrator 32. The output 33 from the global feedback integrator 32 is passed through the global feedback coils 30a,30b and may be passed to the signal processing means.

The feedback field realistically emulates the real external field and is applied approximately equally to both magnetometers 25a,25b. Enclosing the magnetometers 25a,25b within the global coils 25a,25b therefore enables the earth's magnetic field to be suppressed at the magnetometers 25a, 25b. The output from the global feedback integrator 32 gives a measure of the current in the feedback coils 30a,30b. The output data, for input to the data processing means, therefore comprises the individual magnetometer outputs 29a,29b and the current in the global feedback coils 30a,30b (output 33).

The use of global feedback eases the matching requirements of the separate magnetometer channels and eliminates problems associated with field induced noise, hysteresis and field modulation problems are also reduced. It also eases the required orientational alignment accuracy of the magnetometers 25a,25b. The use of the local feedback coils 26a,26b associated with each SQUID magnetometer 25a,25b enables the low noise and fine resolution required for magnetic field gradient measurement. Furthermore, it provides enough dynamic range in the global outer loop 30a,30b to handle the earth's magnetic field.

When operated from a moving platform to measure distant magnetic sources, the magnetometers 25a,25b to be able to cope with being turned over in the earth's magnetic field (~70 $\mu$T), which represents a change of ~140 $\mu$T. Typically, SQUID magnetometers are sensitive to 10 fT and therefore this is a dynamic range of 1 part in $1.4 \times 10^{10}$, or 203 dB, which is not achievable using semiconductor based readout electronics. However, by cancelling out the uniform field and measuring magnetic field gradients the dynamic range problem may be overcome.

When operated from a fixed platform to measure near magnetic sources, the cancellation of uniform field is also preferable. In such measurements, distant magnetic gradient sources may also interfere with the measurements. This may be overcome by measuring and cancelling the external gradients using global feedback.

The following description relates to the gradiometer when configured to measure distant sources from a moving platform. Consider the two magnetometers 25a,25b sensing magnetic fields $B_A$ and $B_B$. The field gradient is $(B_A-B_B)$ and the average field half way between them is $(B_A+B_B)/2$ which is proportional to the sum of the fields. The magnetic fields $B_A$, $B_B$ are summed (31), and this sum is fed back, via integral feedback to the global coils 30a,30b (the factor ½ is adjusted for automatically by the integrator 32). The magnetic field half way between the magnetometers 25a,25b is therefore always maintained constant (or zero if initially zero), as required.

The two magnetometers 25a,25b now have the uniform component of the earth's magnetic field, $B_E$, removed, to give $(B_A-B_E)$ and $(B_B-B_E)$. If the magnetic field gradient is required, $(B_A-B_B)$, in conventional gradiometer systems this is derived by subtracting the magnetometer outputs. However, it is almost certain that the magnetometers will have slightly different scaling of their outputs (mismatch) and be very slightly misaligned and misoriented, as conventional electronics may only be linear to about 1 in $10^4$ and may be matched with similar accuracy. Misorientation of the magnetometers by only 0.1 degree for example leads to an error of $1.5 \times 10^{-6}$. In order to measure magnetic fields of the order of 100 fT m$^{-1}$ in the background of the earth's magnetic field (~70 $\mu$T), an accuracy of the order of 1 part in $10^{10}$ is required and this is clearly difficult to achieve with such misorientation effects.

Rather than attempting to subtract the sensor outputs, as in the prior art, the present system utilises an energy minimisation algorithm which is subject to a suitable constraint designed to recover the gradient information. An energy minimisation algorithm may also be employed to obtain a total field measurement from three orthogonal magnetometers in the same way.

This method of obtaining the gradient information is adaptive in the sense that it constantly tries to improve the balance based on the history of the sensor outputs over a chosen timescale. The use of this energy minimisation algorithm allows the use of global (common mode) feedback to overcome many of the problems in existing systems, such as the problems of stability, uniformity of feedback and the need to calibrate and fix the balance.

An adaptive signal processing algorithm (ASPA) is used to obtain the magnetic field gradient measurement from the magnetometer outputs and is an essential aspect of the invention in order to achieve the high level of balance required. Furthermore, the ASPA is advantageous in that it offers a balancing technique which maybe performed continuously in real time. The principle of the ASPA is based on a well known mathematical techniques which is used extensively in other types of system, for example adaptive beam forming in phased array antennas. Further details of this technique may be found in *Radar Array Processing*, by S. Haykin, J. Litva and T. J. Shepherd (pub. Spinger-Verlag (1993)).

In the case of gradient measurement the ASPA functions by forming the outputs of (for example) two magnetometers, aligned and separated in the z direction, $B_{z1}$ and $B_{z2}$ into a linear combination, $\omega_1 B_{z1} + \omega_2 B_{z2}$. The energy of this combination, over a defined time window, is minimised by adjusting the coefficients $\omega_1$ and $\omega_2$ subject to one or more constraints. The purpose of the constraint is to avoid the trivial solution $\omega_1 = \omega_2 = 0$ and yield the desired gradient information. This procedure is referred to as the adaptive balancing of the gradiometer system.

The form of the constraint is $S^T \omega = \mu$, where S and $\mu$ are chosen constraint matrices ($^T$=transpose). For example, if the two magnetometers 25a,25b were perfectly matched and aligned, and the following constraint is applied;

$$(1\ 0)\begin{pmatrix}\omega_1\\\omega_2\end{pmatrix}=1$$

(where $S^T=(1\ 0)$ and $\mu=1$) i.e. $\omega_1=1$, the algorithm would calculate $\omega_2=-1$. The output, which is the linear combination $\omega_1 B_{z1} + \omega_2 B_{z2}$, would then be $B_{z1}-B_{z2}$ i.e. the required gradient. If the sensors were mismatched then $\omega_2$ will automatically differ from $-1$ by that mismatch, thus correcting for it without the need for calibration.

Figure 4:
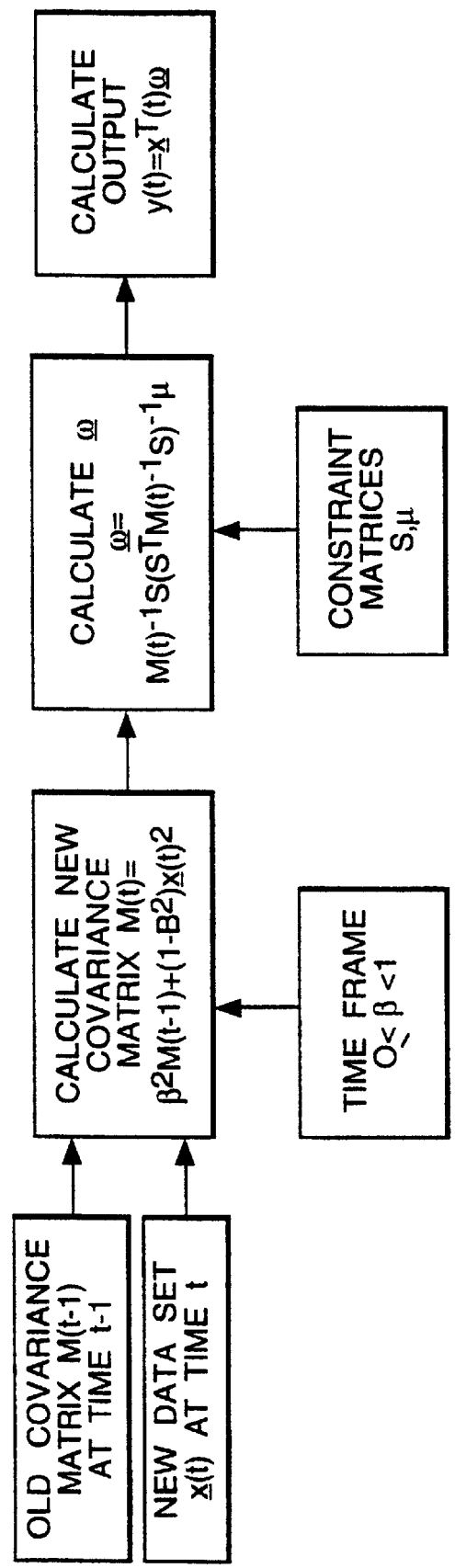
FIG. 4 shows a flow diagram to illustrate an adaptive signal processing algorithm (ASPA) which may be included in the invention.

A flow diagram to illustrate the operation of the ASPA is shown in FIG. 4. The output at time t,y(t), is given by;

$$y(t)=\underline{x}^T(t)\underline{\omega}$$

where $\underline{x}(t)$ is the input data set at time t (i.e. the magnetometer outputs) and $\omega$ is given by $M(t)^{-1}S(S^T M(t)^{-1}S)^{-1}\mu$. $M(t)$ is the covariance matrix at time t and is given by;

$$M(t)=\beta hu\ 2M(t-1)+(1-\beta^2)\underline{x}(t)^2$$

For each new input data set, $\underline{x}(t)$, the algorithm computes the covariance matrix, $M(t)$, which depends on the preceeding covariance matrix, $M(t-1)$, at time $t-1$.

The system shown in FIG. 5 includes two magnetometers 25a,25b for sensing the magnetic field and illustrates the principle of operation of a gradiometer system with global feedback which may be used to give information on both the field gradient in one direction and the total magnetic field e.g. $B_x$ and $dB_x/dx$. If the two magnetometers 25a,25b are perfectly aligned, two magnetometers are sufficient to give an accurate field gradient measurement. However, if there is any misalignment of the magnetometers (which inevitably occurs), the magnetometers 25a,25b may also be sensitive to magnetic fields in the orthogonal y and z directions.

In practice, therefore, a more useful system will include magnetometers for monitoring the two directions orthogonal to the gradient sensing magnetometers 25a,25b. These fields are then accounted for in the ASPA to give a more accurate measure of the field gradient $dB_x/dx$. (In addition, the measurements of $B_y$ and $B_z$ may be used with that of $B_x$ to obtain the total field using a separate ASPA.)

Figure 6:
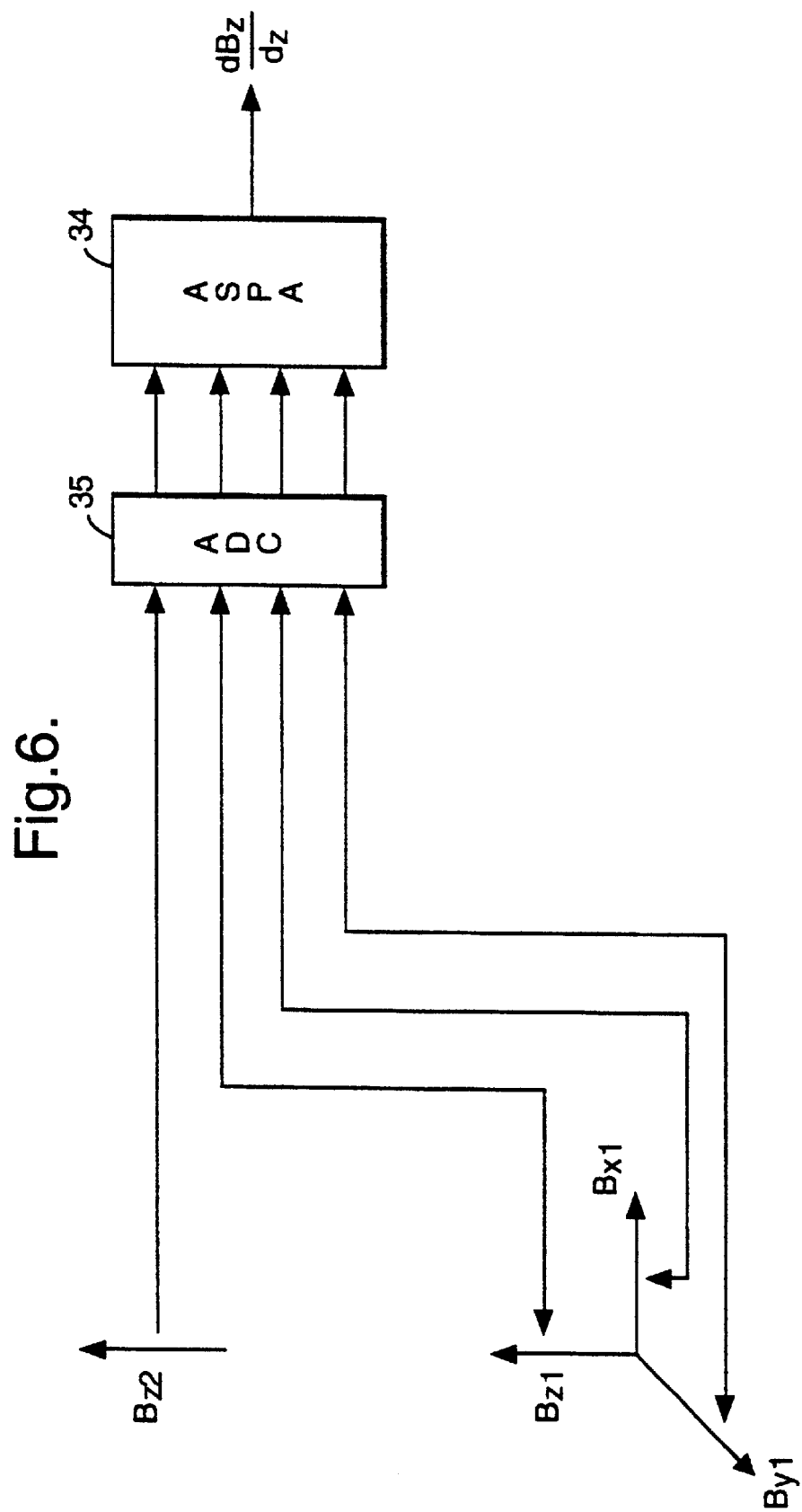
FIG. 6 shows a schematic of a four sensor embodiment of the present invention to illustrate a means for obtaining good balance to measure one gradient.

This is illustrated in FIG. 6 which shows the magnetic field components $B_{Z1}$, $B_{Z2}$, $B_{X1}$, $B_{Y1}$ which are measured by four sensors (not shown in the diagram). The four measured components, $B_{Z1}$, $B_{Z2}$, $B_{X1}$, $B_{Y1}$ are input to an ASPA 34 (via an Analogue to Digital Converter (ADC) 35). The inputs to the ASPA 34 are assigned the weights $\omega_1$, $\omega_2$, $\omega_3$, and $\omega_4$ respectively. One constraint could be $$(1 \ 0 \ 0 \ 0)\begin{pmatrix}\omega_1\\\omega_2\\\omega_3\\\omega_4\end{pmatrix}=1$$

which fixes the coefficient $\omega_1$ to 1 and allows all the others to become freely adjustable by the energy minimisation. The result would be that $\omega_2$ would adjust to nearly −1, as described earlier, and $\omega_3$ and $\psi_4$ would become the required small numbers which correct for misalignment. The output of the ASPA 34 is then;

$$(B_{Z1} \ B_{Z2} \ B_{X1} \ B_{Y1})\begin{pmatrix}\omega_1\\\omega_2\\\omega_3\\\omega_4\end{pmatrix}=\frac{\partial B_z}{\partial z}$$

i.e. the required gradient.

An alternative method which may be preferable would be to perform a subtraction of $B_{Z1}$ and $B_{Z2}$ and use that as one input to the ASPA 34. The input matrix would then be $B_{Z1-BZ2}$, $B_{X1}$, $B_{Y1}$, $B_{Z1}$) and the same constraint would apply.

The energy minimisation occurs over a time frame, set in the software, which is long compared with the signal to be measured. The system therefore becomes self balancing, adjusting itself over that time frame. Any changes of balance comparable with or slower than that period are adapted out, therefore relaxing the stability constraints which apply in simple subtraction methods. Any magnetic field gradients changing more rapidly than the adaptation time will be apparent as measured gradient signals. The algorithm has an efficient update procedure such that each new set of points allows the window to slide along the time series.

The system shown in FIG. 6 requires four magnetometers to accurately measure one gradient, although for each additional gradient measurement only one further magnetometer is required. For example, the addition of one further magnetometer enables a measurement of $dB_y/dy$, with non-idealities in this gradient corrected for by measurements of $B_x$ and $B_z$.

The potentially most useful configuration of the system is a 5-axis gradient gradiometer system. This system may be used to measure the minimum number of gradients required to model all the independent gradients of the magnetic field due to a dipolar source. As a minimum requirement, a 5-axis gradient gradiometer system for measuring gradients $dB_x/dx$, $dB_y/dy$, $dB_x/dy$, $dB_x/dz$ and $dB_y/dz$ comprises eight magnetometers in total. In practice, however, it may be preferable to allow for some redundancy and to configure a 5-axis gradient system with more than the minimum requirement of eight magnetometers.

A multiple-axis gradiometer system operates on the same principle as the single-axis gradiometer described previously. Typically, the global feedback may be applied through a coil set comprising three main feedback coils, such as Helmholtz coils or higher order, one for each direction, x,y,z. The coils set may also comprise additional minor trimming coils to improve the matching at the magnetic sensors and to overcome any nonuniformity in the global coils. The outputs to the coils may be used as the orthogonal field estimators for a total field evaluation by an ASPA. A similar procedure is used to determine the magnetic field gradient measurements. A separate but simultaneous energy minimisation is performed for each gradient component. The input data are either the time series from each magnetometer or linear combinations of the magnetometer outputs. The constraints are then chosen to force the choice of different gradiometer components.

Figure 7:
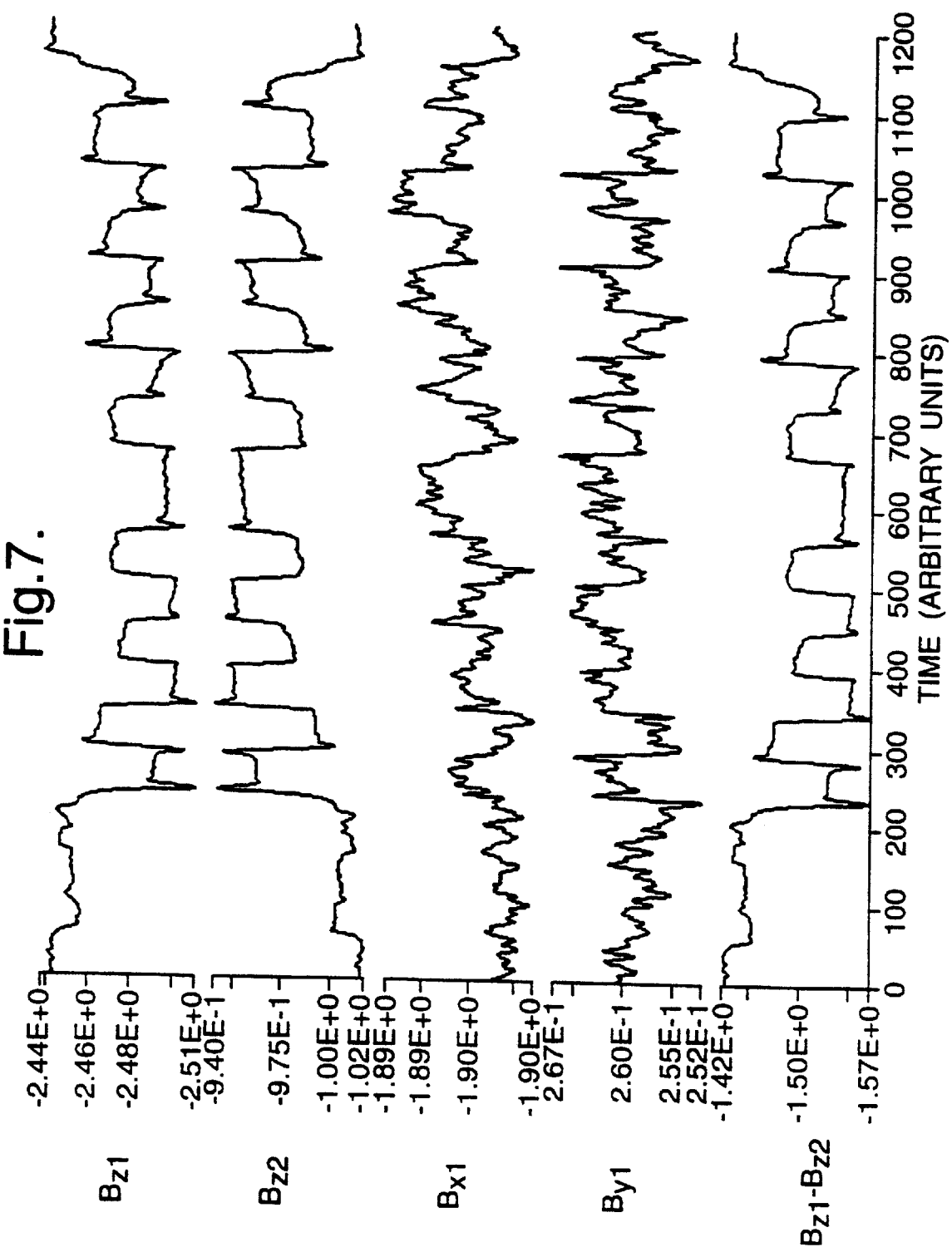
FIG. 7 shows the results obtained from an operational system arranged as in FIG. 6.

FIG. 7 shows the results obtained for an operational system, as illustrated schematically in FIG. 6, comprising two SQUIDs in the Z direction ($Z_1$ and $Z_2$ respectively) and one in each of the orthogonal directions (X and Y). The upper four traces show outputs $B_{Z1}$, $B_{Z2}$, $B_{X1}$, $B_{Y1}$ (as in FIG. 6) and the lower trace shows the gradient measurement $B_{Z1}-B_{Z2}$. The outputs are generated by the movement of a small magnetic dipole. The opposing nature of the $Z_1$ and $Z_2$ signals is an indication that the global feedback scheme is operating correctly i.e. the field half way between the $Z_1$ and $Z_2$ sensors is nulled.

Figure 8:
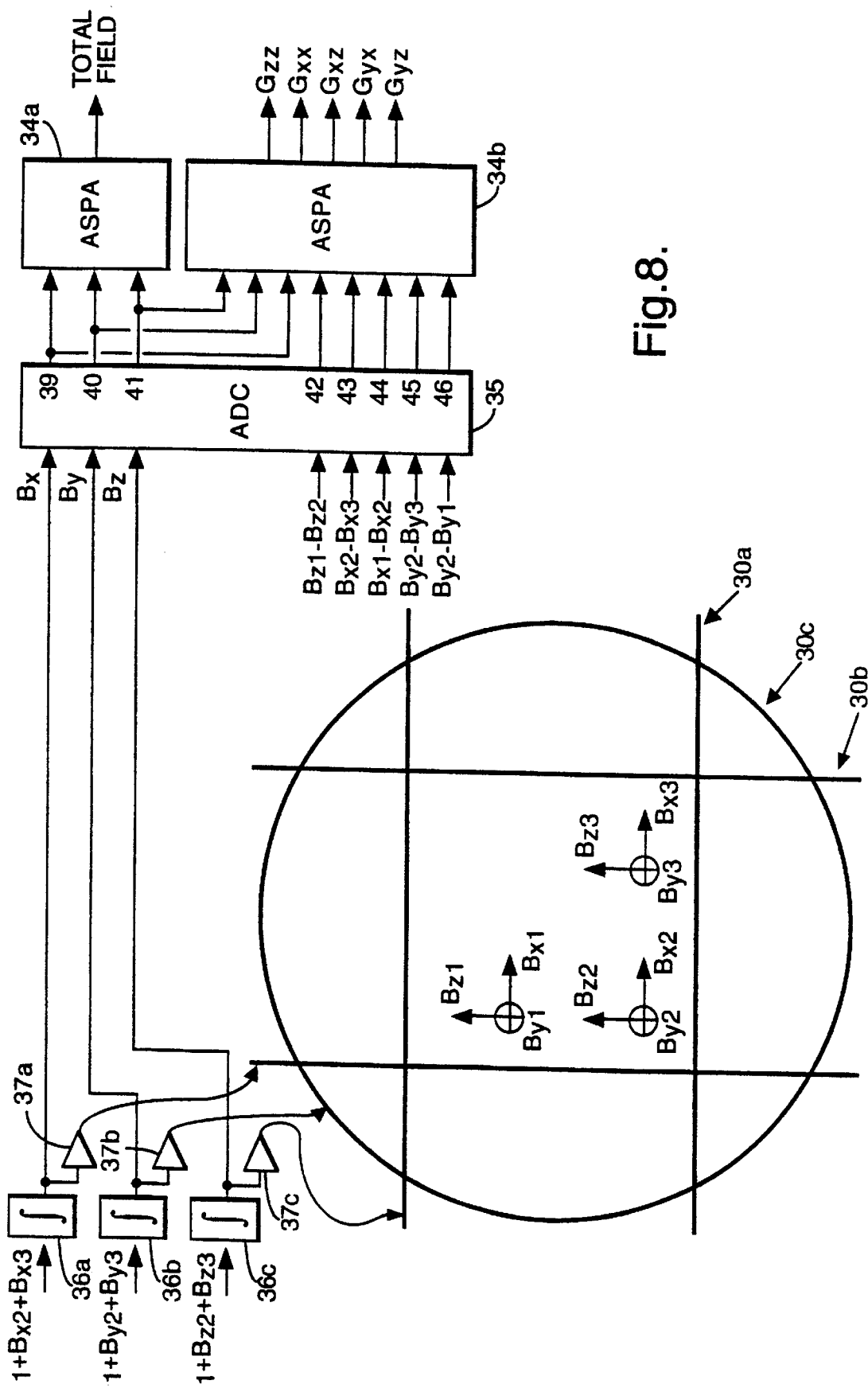

FIG. 8 shows a schematic diagram to illustrate how a gradiometer system may be configured to provide a total field output measurement, $B_T$, and five gradient outputs, $G_{zz}$ ($dB_z/dz$), $G_{xx}$ ($dB_x/dx$), $G_{xz}$ ($dB_x/dz$), $G_{yx}$ ($dB_y/dx$) and $G_{yz}$ ($dB_y/dz$). In this example, the gradiometer comprises nine magnetometers (not shown for clarity), the outputs from which provide measurements of the components of magnetic field, $B_{x1}$, $B_{x2}$, $B_{x3}$, $B_{y1}$, $B_{y2}$, $B_{y3}$, $B_{z1}$, $B_{z2}$, $B_{z3}$ (the directions components of magnetic field are shown in the figure). The magnetic field measurements in each direction, x, y and z, are summed electronically and are passed to associated integrating circuitry 36a,36b,36c, the outputs from which pass through transductance amplifiers 37a,37b, 37c and provide a current to three global feedback coils 30a,30b,30c respectively.

The sums of the magnetic field in each direction x,y,z (i.e. the outputs from the integrators 36a,36b,36c) give a measure of the total magnetic field in the x, y and z directions, $B_x$ $B_y$, and $B_z$ respectively. The global feedback coils 30a,30b,30c are oriented in substantially orthogonal x, y and z directions and, as described previously for the single-axis gradiometer system, have the effect of cancelling the ambient magnetic field.

In order to derive the five gradient measurements, $G_{ZZ}$, $G_{XX}$,$G_{XZ}$, $G_{yx}$ and $G_{yz}$, the magnetic field gradient measurements, $B_{z1}-B_{z2}$, $B_{x2}-B_{x3}$, $B_{x1}-B_{x2}$, $B_{y2}-B_{y3}$ and $By_2-B_{y1}$, are deduced (not shown in the figure) from the magnetometer outputs and these gradient estimators are passed to the ADC 21. The equivalent digital outputs 42,43, 44,45,46 from the ADC 35 are passed to an ASPA 34b, loaded on a computer, along with the digital outputs 39,40, 41, for adaptive signal processing in order to generate the accurate magnetic field gradient information.

In order to obtain a measurement of the total magnetic field, $B_T$, the integrated outputs. $B_x$, $B_y$, and $B_z$, are passed to an ADC 35 and the equivalent digital outputs from which 39,40,41 are passed to an adaptive signal processing algorithm (ASPA) 34a.

For clarity, two adaptive signal processing algorithms 34a,34b are shown in FIG. 8. In practice, however, a separate energy minimisation algorithm (ASPA) is required for each independent gradient measurement. For example, to determine $G_{xx}$, the sums of the magnetic field components in each direction, x, y and z (digital signals 39,40,41) and the difference signal $B_{z1}-B_{Z2}$ (digital signal 42) are used for energy minimisation. A separate energy minimisation routine is also required for the total field measurement. In practice, however, it is be convenient to load all the required algorithms onto a single computer.

The example shown in FIG. 8 represents only one way of linearly combining the outputs from the nine magnetometers so as to obtain five magnetic field gradient measurements. Other linear combinations of the magnetometer outputs may also be used as inputs to the adaptive signal processing algorithm to obtain such information.

The rigidity requirements on the complete structure mean that preferably it should be as light and stiff as possible. One suitable construction may be a tetrahedron of thin walled carbon fibre tubes with groups of magnetometers placed at each vertex. Alternatively, a cruciform structure may be used.

For a gradiometer system designed to be moveable, e.g. on a moving platform, the baseline may typically be between 40 mm and 100 mm, as smaller structures give better rigidity than larger. However, if the gradiometer is to remain static, a larger baseline may be used to give a less rigid gradiometer with better sensitivity. The same sensitivity may be achieved by using more sensitive magnetometers on a shorter baseline to increase rigidity, for example SQUID magnetometers fabricated on 25 mm chips at 40 mm spacing, rather than 10 mm chips on a 100 mm baseline.

Preferably, the global feedback coils must be large enough to generate a substantially uniform field at the magnetometers and the size of the global feedback coils is determined to some extent by the particular application for which the system is to be used. For example, if a large space is available, perhaps for a static structure where the baseline is greater, the global feedback coils may be large, typically 1 m in diameter, creating a uniform field at all magnetometers. Conversely, if the baseline is small and the available space is limited, the global feedback coils may be much smaller, for example 10–20 cm. Particularly for global coils of smaller diameter, minor trimming coils may be used to improve the field matching at the magnetometers and overcome any non uniformity in the global coils.

The importance of having global feedback in the system depends on the sensitivity of the particular magnetometers included in the system. The more sensitive the magnetic sensor, the more important it is to use global feedback to provide a high dynamic range. For the system shown in FIG. 5, comprising SQUID magnetometers of high sensitivity, it is preferable to include global feedback in the system. However, other magnetic sensors may be included in the system, for example flux gates, Hall probes or magnetoresistive devices, which are typically less sensitive than SQUID magnetometers but may be sufficiently sensitive for certain applications.

If less sensitive magnetometers are included, and there is a lower requirement on the dynamic range, the system may be operated without global feedback. In this case, the magnetometer outputs are input to the ASPA for adaptive signal balancing, as described previously, where the required magnetic field gradient or total field information may be output.

If SQUID magnetometers are included in the system they must be operated within a cryogenic environment (e.g. a cryostat containing liquid nitrogen or helium) to maintain the SQUIDs at a suitably low temperature. The local feedback coils may be integrated on the SQUID magnetometer chips which typically have a dimension of between 10 mm and 50 mm. The local feedback coils provide the flux locking for the SQUID. The use of two sets of nested feedback loops achieves the requirement of low noise and fine resolution for the purposes of measuring field gradient, while providing sufficient dynamic range in the outer global feedback loop to handle the earth's magnetic field.

In an alternative embodiment, the system may be used to measure second or higher order magnetic field gradient components (i.e. $d^2B_x/dx^2$. $d^2B_y/dy^2$ etc.). For example, the two magnetometers shown in FIG. 5 may be replaced with three magnetometers orientated in substantially the same direction and spaced equidistantly to measure $B_{x1}$, $B_{x2}$ and $B_{x3}$. The three outputs could be summed and integrated to provide the required global feedback. The required linear combination to measure $\partial^2 B_x/\partial x^2$ is $B_{x1}-2B_{x2}+B_{x3}$ which is easily obtained by choosing a suitable constraint in the ASPA. This configuration may be extended to a multiple axis system. In particular, a system for measuring second or higher order magnetic field gradients may be useful for applications requiring exceptionally high rejection of external interference, such as medical scanning applications.

For some applications, the global feedback coils may be substantially larger than the magnetometer array. This configuration would be useful where the source of the gradient fields to be measured is in close proximity to the magnetometer array. An example of this is in a biomagnetic sensor system. For example, referring to FIG. 9. a human subject 50 in a room 55 may be examined for magnetism using an array of magnetometers 25, such as an array of SQUID magnetometers. In the arrangement shown, global feedback coils 30a,30b,30c surround the human subject 50 and the magnetometers 25. The global feedback coils 30a,30b, 30c are arranged in three substantially orthogonal planes and provide a substantially uniform magnetic field at the magnetic sensors 25. In addition, global feedback coil sets 60a,60b, 60c may be configured to feed back the first order magnetic field gradients (the front most component of coil set 60c is not shown for clarity and part of the rear most component is obscured by the human subject 50). When in operation, the outputs from the magnetic sensors are processed using the adaptive signal processing technique described previously.

In known biomagnetic systems, measurements have to be made in an expensive magnetically shielded room. In the arrangement shown in FIG. 9, the global feedback coils 30a,30b,30c replace this magnetically shielded room. The global feedback coils may be configured to feed back the uniform field and also the first order magnetic field gradients. This provides substantial rejection of external field sources.

In general, the system may be used for several applications where the sensing of magnetic fields is required. For example, the system may be particularly useful for use in geological surveying, non destructive evaluation or in medical applications such as biomagnetic scanning.

We claim:

1. A system for measuring one or more magnetic field gradient component of a magnetic field comprising:
   (i) at least two magnetic sensors for sensing said magnetic field, wherein each sensor generates a sensor output, said sensor outputs having an associated total energy, E, and wherein at least two of the sensors are arranged to sense the magnetic field in substantially the same direction and (ii) means for performing adaptive signal processing of the sensor outputs such that the system is adaptively balanced, whereby said means for performing generates at least one magnetic field gradient component, (iii) global feedback means for providing a substantially uniform magnetic field at the at least two magnetic sensors, and (iv) the adaptive signal processing means comprise means for minimising the total energy, E, of the sensor outputs subject to a constraint, whereby the constraint determines which of one or more magnetic field gradient components is generated.

2. The system of claim 1, wherein the means (34a, 34b, 35) for minimising the total energy, E, of the sensor outputs may also generate a total magnetic field measurement, whereby the constraint determines which of one or more magnetic field gradient components or a total magnetic field measurement is generated.

3. The system of claim 1, wherein the adaptive adaptive signal processing means includes a computer (34a, 34b, 35) having an adaptive signal processing algorithm (ASPA) loaded therein.

4. The system of claim 1, wherein the global feedback means are arranged to provide a substantially uniform magnetic field at the two or more magnetic sensors.

5. The system of claim 1, wherein the global feedback means comprise at least one global feedback coil set (30a, 30b).

6. The system of claim 5, wherein the one or more global feedback coil set each comprise two or more Helmholtz coils.

7. The system of claim 6, and also including
means for generating at least one difference signal between two sensor outputs, wherein said sensor outputs each correspond to a magnetic field in substantially the same direction, and
analogue to digital conversion means (35) for converting the one or more difference signal and the two or more sensor outputs into equivalent digital data.

8. The system of claim 1, wherein at least one of the magnetic sensors is any one of a flux gate, a Hall probe or a magneto-resistive sensor.

9. The system of claim 1, wherein at least one of the magnetic sensors is a SQUID magnetometer.

10. The system of claim 9, and also comprising cooling means for reducing the temperature of the SQUID magnetometer.

11. The system of claim 10, wherein each SQUID magnetometer has associated local feedback means (26a, 26b) for maintaining a substantially constant state of magnetic flux in the respective SQUID magnetometer.

12. The system of claim 1, comprising;
at least four magnetic sensors for sensing a magnetic field, wherein three of the sensors are arranged such that they sense the magnetic field in three substantially orthogonal directions and wherein at least two of said sensors are arranged such that they sense the magnetic field in substantially the same direction.

13. The system of claim 12, comprising at least eight magnetic sensors.

14. The system of claim 13, wherein the eight or more magnetic sensors are arranged at the vertices of a tetrahedron structure.

15. The system of claim 14, wherein the global feedback means comprise three global feedback coil sets (30a, 30b, 30c) oriented in three substantially orthogonal directions, for generating a substantially uniform magnetic field at each of the eight or more magnetic sensors.

16. The system of claim 1, comprising at least three magnetic sensors, wherein at least three of the sensors are oriented in substantially the same direction and whereby the means for performing adaptive signal processing may generate a magnetic field gradient component of at least second order.

17. The system of claim 1, wherein the system is arranged to provide a biomagnetic sensing system (55).

18. The system of claim 17, wherein the global feedback means comprise at least one global feedback coil set (30a, 30b or 30c) arranged to surround a subject (50) generating a magnetic field to be measured, wherein the subject (50) is in close proximity with the two or more magnetic sensors (25).

19. A method for measuring at least one magnetic field gradient component using a gradiometer comprising the steps of;

(i) sensing a magnetic field component at at least two positions using at least two magnetic sensors, wherein at least two of the magnetic field components are sensed in substantially the same direction, (ii) generating two or more output signals, having an associated total energy, E, corresponding to said magnetic field components, (iii) providing global feedback in the form of a substantially uniform magnetic field at the at least two magnetic sensors, (iv) performing adaptive signal processing of the output signals and minimising the total energy, E, of the output signals subject to a constraint such that the gradiometer is adaptively balanced, (v) constraining the minimisation of the total energy, E, such that a magnetic field gradient component is generated, and (vi) generating at least one magnetic field gradient component measurement.

20. The method of claim 19, comprising the steps of:

(i) minimising the total energy, E, of the output signals subject to a constraint such that the gradiometer is adaptively balanced, and (ii) constraining the minimisation of the total energy, E, such that a total magnetic field measurement is generated.

21. The method of claim 19, wherein the magnetic field components at two or more positions are sensed using two or more magnetic sensors (25a, 25b), and further comprising the step of providing a substantially uniform magnetic field gradient at the two or more magnetic sensors.

22. The method of claim 21 for measuring magnetic field components in a human subject (50) in close proximity with the two or more magnetic sensors (25).

23. The method of claim 19, comprising the steps of:

(i) sensing the magnetic field component at three or more positions, wherein at least three of said magnetic field components are sensed in substantially the same direction, (ii) minimising the total energy, E, of the output signals subject to a constraint such that the gradiometer is adaptively balanced, and (iii) constraining the minimisation of the total energy, E, such that a magnetic field gradient component of at least second order is generated.

* * * * *